United States Patent
Cheon et al.

(10) Patent No.: US 9,252,363 B2
(45) Date of Patent: Feb. 2, 2016

(54) ARYLOXYALKYLCARBOXYLATE SOLVENT COMPOSITIONS FOR INKJET PRINTING OF ORGANIC LAYERS

(71) Applicant: Universal Display Corporation, Ewing, NJ (US)

(72) Inventors: Kwang-Ohk Cheon, Holland, PA (US); Angang Dong, Ewing, NJ (US); Michael Inbasekaran, Lawrenceville, NJ (US); Suman Layek, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 700 days.

(21) Appl. No.: 13/644,480

(22) Filed: Oct. 4, 2012

(65) Prior Publication Data

US 2014/0097406 A1    Apr. 10, 2014

(51) Int. Cl.
*H01L 51/54* (2006.01)
*H01L 51/56* (2006.01)
*H01B 1/12* (2006.01)
*H01L 51/00* (2006.01)
*H01L 51/50* (2006.01)

(52) U.S. Cl.
CPC ........ *H01L 51/0007* (2013.01); *H01L 51/0005* (2013.01); *H01L 51/0085* (2013.01); *H01L 51/506* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,230,107 B1 | 6/2007 | Herron et al. | |
| 7,232,618 B2 | 6/2007 | Yamada et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,655,323 B2 | 2/2010 | Walters et al. | |
| 7,968,146 B2 | 6/2011 | Wanger et al. | |
| 8,174,000 B2 | 5/2012 | Cheon et al. | |
| 2001/0015432 A1 | 8/2001 | Igarashi | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0072964 A1 | 4/2003 | Kwong et al. | |
| 2003/0138657 A1 | 7/2003 | Li et al. | |

(Continued)

FOREIGN PATENT DOCUMENTS

| | | |
|---|---|---|
| EP | 0650955 | 5/1995 |
| EP | 1238981 | 9/2002 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Andrew K Bohaty
(74) *Attorney, Agent, or Firm* — Duane Morris LLP

(57) ABSTRACT

A liquid composition (e.g., inkjet fluid) for forming an organic layer of an organic electronic device (e.g., an OLED). The liquid composition comprises a small molecule organic semiconductor material mixed in a solvent in which the solvent compound has the following formula:

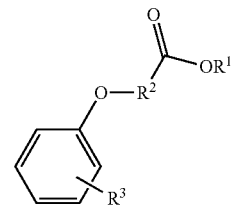

wherein $R^1$ is $C_{1-6}$ alkyl; $R^2$ is $C_{1-6}$ alkyl; and $R^3$ is one or more optional substitutions independently selected from $C_{1-6}$ alkyl and lower aryl.

17 Claims, 3 Drawing Sheets

(56) References Cited

U.S. PATENT DOCUMENTS

| | | |
|---|---|---|
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0115476 A1 | 6/2004 | Oshiyama et al. |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0123751 A1 | 6/2005 | Tsutsui et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0121308 A1 | 6/2006 | Katoh et al. |
| 2006/0127696 A1 | 6/2006 | Stossel et al. |
| 2006/0182992 A1 | 8/2006 | Nii et al. |
| 2006/0182993 A1* | 8/2006 | Ogata et al. ............ 428/690 |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0087321 A1 | 4/2007 | Pribenszky et al. |
| 2007/0103060 A1 | 5/2007 | Itoh et al. |
| 2007/0111026 A1 | 5/2007 | Deaton et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0261076 A1 | 10/2008 | Kwong et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2009/0302743 A1 | 12/2009 | Kato et al. |
| 2009/0309488 A1 | 12/2009 | Kato et al. |
| 2010/0012931 A1 | 1/2010 | Kato et al. |
| 2010/0084966 A1 | 4/2010 | Otsu et al. |
| 2010/0090591 A1 | 4/2010 | Alleyne et al. |
| 2010/0148663 A1 | 6/2010 | Tsai et al. |
| 2010/0187984 A1 | 7/2010 | Lin et al. |
| 2010/0200841 A1* | 8/2010 | Cheon et al. ............ 257/40 |
| 2010/0244004 A1 | 9/2010 | Xia et al. |
| 2010/0295032 A1 | 11/2010 | Kwong et al. |
| 2010/0323464 A1* | 12/2010 | Cheon et al. ............ 438/22 |
| 2011/0057559 A1 | 3/2011 | Xia et al. |
| 2011/0163302 A1 | 7/2011 | Lin et al. |
| 2011/0204333 A1 | 8/2011 | Xia et al. |
| 2013/0026452 A1 | 1/2013 | Kottas et al. |
| 2013/0119354 A1 | 5/2013 | Ma et al. |

FOREIGN PATENT DOCUMENTS

| | | |
|---|---|---|
| EP | 1725079 | 11/2006 |
| EP | 2034538 | 3/2009 |
| EP | 1841834 | 5/2009 |
| EP | 2350216 | 10/2009 |
| JP | 2005-11610 | 1/2005 |
| JP | 2007-123392 | 5/2007 |
| JP | 2007-254297 | 10/2007 |
| JP | 2009-227514 | 10/2009 |
| JP | 2010-135467 | 6/2010 |
| WO | Wo 01/39234 | 5/2001 |
| WO | WO 02/02714 | 1/2002 |
| WO | WO 02/15645 | 2/2002 |
| WO | WO 03/040257 | 5/2003 |
| WO | WO 03/060956 | 7/2003 |
| WO | WO 2004/093207 | 10/2004 |
| WO | WO 2004/107822 | 12/2004 |
| WO | WO 2004/111066 | 12/2004 |
| WO | WO 2005/014551 | 2/2005 |
| WO | WO 2005/030900 | 4/2005 |
| WO | WO 2005/089025 | 9/2005 |
| WO | WO 2005/123873 | 12/2005 |
| WO | WO 2006/009024 | 1/2006 |
| WO | WO 2006/056418 | 6/2006 |
| WO | WO 2006/072002 | 7/2006 |
| WO | WO 2006/082742 | 8/2006 |
| WO | WO 2006/098120 | 9/2006 |
| WO | WO 2006/100298 | 9/2006 |
| WO | WO 2006/103874 | 10/2006 |
| WO | WO 2006/114966 | 11/2006 |
| WO | WO 2006/132173 | 12/2006 |
| WO | WO 2007/002683 | 1/2007 |
| WO | WO 2007/004380 | 1/2007 |
| WO | WO 2007/063754 | 6/2007 |
| WO | WO 2007/063796 | 6/2007 |
| WO | WO 2008/044723 | 4/2008 |
| WO | WO 2008/056746 | 5/2008 |
| WO | WO 2008/057394 | 5/2008 |
| WO | WO 2008/161842 | 8/2008 |
| WO | WO 2008/132085 | 11/2008 |
| WO | WO 2009/000673 | 12/2008 |
| WO | WO 2009/003898 | 1/2009 |
| WO | WO 2009/008311 | 1/2009 |
| WO | WO 2009/018009 | 2/2009 |
| WO | WO 2009/021126 | 2/2009 |
| WO | WO 2009/050290 | 4/2009 |
| WO | WO 2009/062578 | 5/2009 |
| WO | WO 2009/063833 | 5/2009 |
| WO | WO 2009/066778 | 5/2009 |
| WO | WO 2009/066779 | 5/2009 |
| WO | WO 2009/086028 | 7/2009 |
| WO | WO 2009/100991 | 8/2009 |
| WO | WO 2010/011390 | 1/2010 |
| WO | WO 2010/028151 | 3/2010 |
| WO | WO 2010/056066 | 5/2010 |
| WO | WO 2010/079051 | 7/2010 |
| WO | WO 2010/086089 | 8/2010 |
| WO | WO 2010/107244 | 9/2010 |
| WO | WO 2010/111175 | 9/2010 |
| WO | WO 2010/147818 | 12/2010 |
| WO | WO 2011/044988 | 4/2011 |
| WO | WO 2011/051404 | 5/2011 |
| WO | WO 2011/075644 | 6/2011 |
| WO | WO 2011/086863 | 7/2011 |
| WO | WO 2011/087601 | 7/2011 |

OTHER PUBLICATIONS

Baldo et al., "Very high-efficiency green orgainc light-emitting devices based on electrophosphorescence," Appl. Phys. Lett., vol. 75, No. 1, 4-6 (1999).

Adachi, Chihaya et al., "Organic Electroluminescent Device Having a Hole Conductor as an Emitting Layer," *Appl. Phys. Lett.*, 55(15):1489-1491 (1989).

Adachi, Chihaya et al., "High-Efficiency Red Electrophosphorescence Devices," *Appl. Phys. Lett.*, 78(11):1622-1624 (2001).

Adachi, Chihaya et al., "Nearly 100% Internal Phosphorescence Efficiency in an Organic Light Emitting Device," *J. Appl. Phys.*, 90(10):5048-5051 (2001).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

(56) References Cited

OTHER PUBLICATIONS

Chang, Chiung-Fang et al, "Highly Efficient Blue-Emitting Iridium(III) Carbene Complexes and Phosphorescent OLEDs," *Angew. Chem. Int. Ed.* 47, 4542 (2008).

Gao, Zhiqiang et al., "Bright-Blue Electroluminescence From a Silyl-Substituted ter-(phenylene-vinylene) derivative," *Appl. Phys. Lett.*, 74(6):865-867 (1999).

Guo, Tzung-Fang et al., "Highly Efficient Electrophosphorescent Polymer Light-Emitting Devices," *Organic Electronics*, 1:15-20 (2000).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Holmes, R.J. et al., "Blue Organic Electrophosphorescence Using Exothermic Host-Guest Energy Transfer," *Appl. Phys. Lett.*, 82(15):2422-2424 (2003).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Ikeda, Hisao et al., "P-185: Low-Drive-Voltage OLEDs with a Buffer Layer Having Molybdenum Oxide," *SID Symposium Digest*, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Kido, Junji et al., 1,2,4-Triazole Derivative as an Electron Transport Layer in Organic Electroluminescent Devices, *Jpn. J. Appl. Phys.*, 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

Kwong, Raymond C. et al., "High Operational Stability of Electrophosphorescent Devices," *Appl. Phys. Lett.*, 81(1):162-164 (2002).

Lamansky, Sergey et al., "Synthesis and Characterization of Phosphorescent Cyclometalated Iridium Complexes," *Inorg. Chem.*, 40(7):1704-1711 (2001).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Lo, Shih-Chun et al., "Blue Phosphorescence from Iridium(III) Complexes at Room Temperature," *Chem. Mater.*, 18(21):5119-5129 (2006).

Ma, Youguang et al., "Triplet Luminescent Dinuclear-Gold(I) Complex-Based Light-Emitting Diodes with Low Turn-On voltage," *Appl. Phys. Lett.*, 74(10):1361-1363 (1999).

Mi, Bao-Xiu et al., "Thermally Stable Hole-Transporting Material for Organic Light-Emitting Diode: an Isoindole Derivative," *Chem. Mater.*, 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Niu, Yu-Hua et al., "Highly Efficient Electrophosphorescent Devices with Saturated Red Emission from a Neutral Osmium Complex," *Chem. Mater.*, 17(13):3532-3536 (2005).

Noda, Tetsuya and Shirota, Yasuhiko, "5,5'-Bis(dimesitylboryl)-2,2'-bithiophene and 5,5"-Bis(dimesitylboryl)-2,2':5',2'-terthiophene as a Novel Family of Electron-Transporting Amorphous Molecu;ar Materials," *J. Am. Chem. Soc.*, 120 (37):9714-9715 (1998).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Östergård, T. et al., "Langmuir-Blodgett Light-Emitting Diodes of Poly(3-Hexylthiophene): Electro-Optical Characteristics Related to Structure," *Synthetic Metals*, 87:171-177 (1997).

Palilis, Leonidas C., "High Efficiency Molecular Organic Light-Emitting Diodes Based on Silole Derivatives and Their Exciplexes," *Organic Electronics*, 4:113-121 (2003).

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Salbeck, J. et al., "Low Molecular Organic Glasses for Blue Electroluminescence," *Synthetic Metals*, 91:209-215 (1997).

Shirota, Yasuhiko et al., "Starburst Molecules Based on π-Electron Systems as Materials for Organic Electroluminescent Devices," *Journal of Luminescence*, 72-74:985-991 (1997).

Sotoyama, Wataru et al., "Efficient Organic Light-Emitting Diodes with Phosphorescent Platinum Complexes Containing N C N-Coordinating Tridentate Ligand," *Appl. Phys. Lett.*, 86:153505-1-153505-3 (2005).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Takizawa, Shin-ya et al., "Phosphorescent Iridium Complexes Based on 2-Phenylimidazo[1,2- α]pyridine Ligands: Tuning of Emission Color toward the Blue Region and Application to Polymer Light-Emitting Devices," *Inorg. Chem.*, 46(10):4308-4319 (2007).

Tang, C.W. and VanSlyke, S.A., "Organic Electroluminescent Diodes," *Appl. Phys. Lett.*, 51(12):913-915 (1987).

Tung, Yung-Liang et al., "Highly Efficient Red Phosphorescent Osmium(II) Complexes for OLED Applications," *Organometallics* 23, 3745 (2004).

Tung, Yung-Liang et al., "Organic Light-Emitting Diodes Based on Charge-Neutral $Ru^{II}$ Phosphorescent Emitters," *Adv. Mater.*, 17(8):1059-1064 (2005).

Van Slyke, S. A. et al., "Organic Electroluminescent Devices with Improved Stability," *Appl. Phys. Lett.*, 69(15): 2160-2162 (1996).

Wang, Y. et al., "Highly Efficient Electroluminescent Materials Based on Fluorinated Organometallic Iridium Compounds," *Appl. Phys. Lett.*, 79(4):449-451 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Wong, Wai-Yeung et al., "Multifunctional Iridium Complexes Based on Carbazole Modules as Highly Efficient Electrophosphors," *Angew Chem. Int. Ed.*, 45:7800-7803 (2006).

\* cited by examiner

ARYLOXYALKYLCARBOXYLATE SOLVENT COMPOSITIONS FOR INKJET PRINTING OF ORGANIC LAYERS

TECHNICAL FIELD

The present invention relates to methods for making organic layers in organic electronic devices, such as organic light emitting devices.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND

Traditionally, organic light emitting devices (OLEDs) have been fabricated by vacuum deposition for small molecule materials, and by spin-coating or dip coating for polymeric materials. More recently, inkjet printing has been used to directly deposit organic thin film layers in the fabrication of OLEDs. For inkjet printing of polymeric materials, a variety of conventional solvents can be used, such as toluene or xylene. However, these solvents conventionally used for inkjet printing of polymeric materials often do not work as well for the deposition of small molecule materials because their relatively low boiling points allow the solvent to dry too fast, causing the print nozzles to clog. Also, upon deposition, too rapid drying of the solvent can result in inferior film morphology.

Thus, inkjet printing of small molecule materials often requires the use of relatively higher boiling point solvents. However, using higher boiling point solvents present their own problems. Because of their higher boiling point, such solvents can be difficult to remove from the deposited organic layer. Baking at high temperatures can accelerate the removal of the solvent, but this can cause heat degradation of the device. Also, even baking at high temperatures may not completely remove the solvent residue from the deposited organic layer. Since solvent materials are generally electrically insulative, solvent residue remaining in the deposited organic layer can interfere with the performance of electronic devices. Also, many solvents have a viscosity that is too low for good film formation by inkjet printing. Thus, there is a need for an improved inkjet fluid formulation suitable for the inkjet printing of small molecule materials to form organic layers.

SUMMARY

The present invention provides an improved method of forming an organic layer by solution processing (e.g. inkjet printing) using a solvent having characteristics (e.g. boiling point, viscosity, etc.) that promote good film formation. Organic electronic devices, such as OLEDs, using organic layers deposited by the method may have improved device performance.

In one embodiment, the present invention provides a liquid composition comprising: a small molecule organic semiconductor material at a concentration in the range of 0.01-10 wt %; and a solvent having a melting point of 25° C. or lower, the solvent compound having the following formula, wherein $R^1$ is $C_{1-6}$ alkyl; $R^2$ is $C_{1-6}$ alkyl; and $R^3$ is one or more optional substitutions independently selected from $C_{1-6}$ alkyl and aryl:

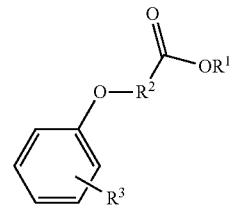

In another embodiment, the present invention provides a method of forming an organic layer for an organic electronic device, comprising depositing the liquid composition of the present invention on a surface; and drying the liquid composition to form the organic layer on the surface. In another embodiment, the present invention provides an organic electronic device comprising: an anode; a cathode; an organic layer between the anode and the cathode, wherein the organic layer is made using the liquid composition of the present invention

DETAILED DESCRIPTION

Figure 1:
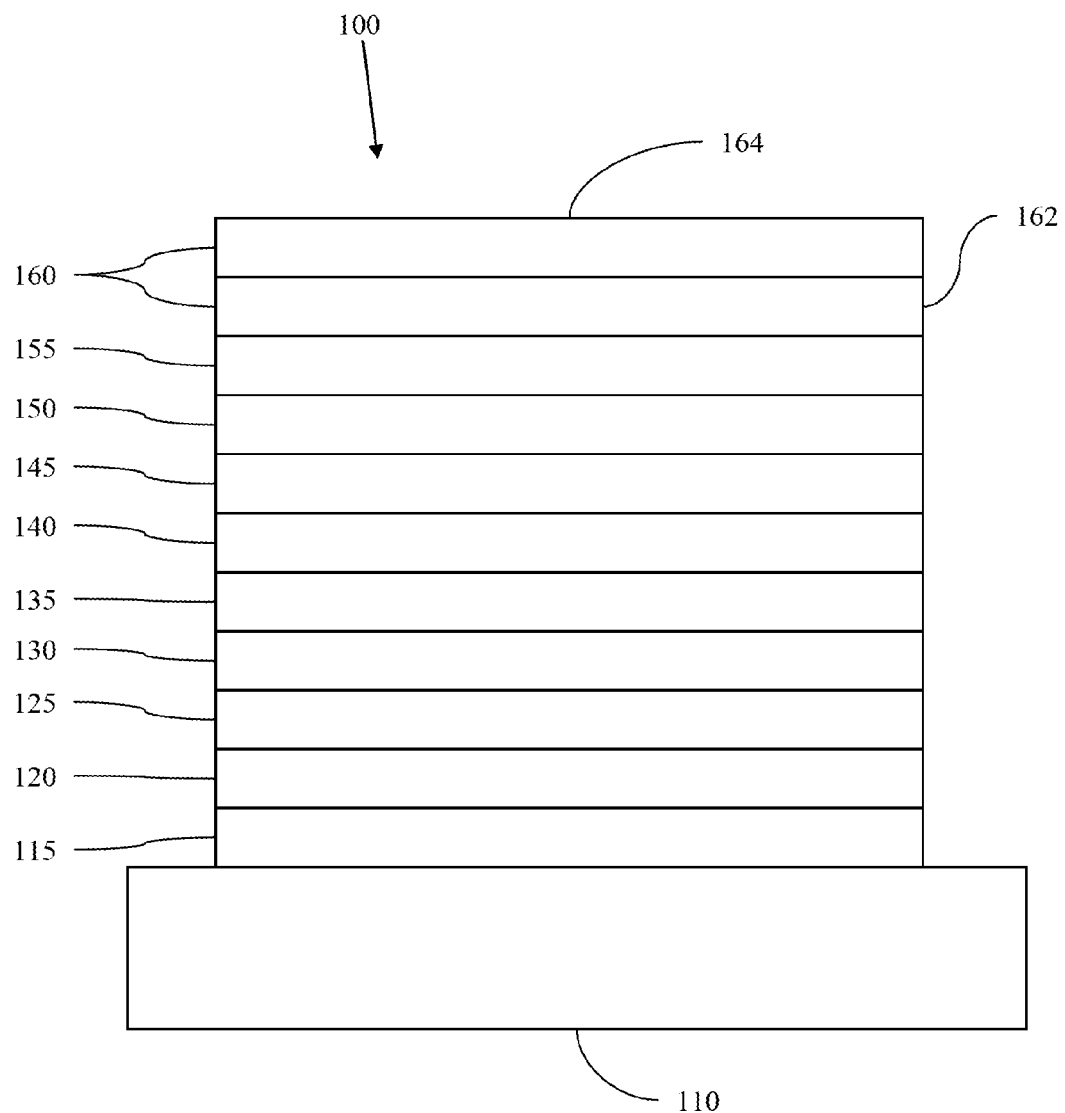
FIG. 1 shows the structure of an OLED according to an embodiment of the present invention.

The present invention relates to the forming of organic layers by solution processing techniques. In one aspect, the present invention provides a liquid composition which can be used for forming an organic layer by solution processing techniques. The liquid composition comprises a small molecule organic semiconductor material mixed in a solvent in which the solvent compound has the following formula:

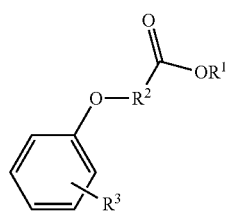

wherein $R^1$ is $C_{1-6}$ alkyl; $R^2$ is $C_{1-6}$ alkyl; and $R^3$ is one or more optional substitutions independently selected from $C_{1-6}$ alkyl and lower aryl. The term "alkyl" means alkyl moieties and encompasses both straight and branched alkyl chains, such as methyl, ethyl, propyl, isopropyl, butyl, isobutyl, tert-butyl, and the like. The term "aryl" means a hydrocarbyl containing at least one aromatic ring, such as substituted phenyl. The term "lower aryl" means an aryl containing from 3-15 carbon atoms. Representative examples of solvents having this formula include the following:

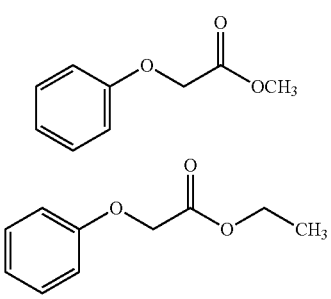

Methyl phenoxyacetate (BP ~245° C.) Ethyl phenoxyacetate (BP ~247° C.)

The solvent used in the present invention may have various chemical/physical properties that make it useful for forming organic layers by solution processing techniques, such as inkjet printing. For example, the solvent may have a melting point of 25° C. or lower. In some cases, the solvent compound has a molecular weight in the range of 166-400. In some cases, the solvent has a boiling point of 260° C. or lower at 1 atm; and in some cases, in the range of 150-260° C. at 1 atm, but other boiling point ranges are also possible. Boiling points in this range may be sufficiently high to prevent nozzle clogging of an inkjet print head, but sufficiently low to allow removal by drying/baking during device fabrication.

The organic semiconductor material is a small molecule organic compound (including organometallic compounds) which is capable of exhibiting semiconducting properties, i.e., in which the energy gap between conduction and valence bands is in the range of 0.1-4 eV. The small molecule organic semiconductor material may be any of those known or proposed to be used in the fabrication of organic electronic devices, such as organic light emitting devices. For example, the organic semiconductor material may be a charge transport compound (hole or electron transporting, or hole or electron injecting) or an emissive phosphorescent compound.

The term "small molecule" refers to any compound that is not a polymer, and "small molecules" may actually be relatively large. Small molecules may include repeat units in some circumstances. For example, using a long chain alkyl group as a substituent does not exclude the molecule from being a "small molecule." In general, a small molecule has a well-defined chemical formula with a single molecular weight, whereas a polymer has a chemical formula and a molecular weight that may vary from molecule to molecule. The molecular weight of the small molecule organic semiconductor material is typically 3,000 or less.

In some cases, the organic semiconductor material is a phosphorescent emitting compound. Any of various types of phosphorescent emitting compounds may be suitable, including the organometallic complexes of transition metals described in U.S. Pat. No. 6,902,830 (Thompson et. al.); and U.S. Published Appln. No. 2006/0251923 (Lin et al.), No. 2007/0088167 (Lin et al.), No. 2006/0008673 (Kwong et al.), and No. 2007/0003789 (Kwong et al.), all of which are incorporated by reference herein.

The concentration of the organic semiconductor material in the liquid composition will vary according to the particular application. In certain embodiments, the organic semiconductor material is provided at a concentration that is suitable for inkjet printing. In some cases, the concentration of the organic semiconductor material is in the range of 0.01-10 wt %; and in some cases, in the range of 0.01-2 wt %; and in some cases, in the range of 0.1-1 wt %. The viscosity of the liquid composition will vary according to the particular application. For use in inkjet printing, an appropriate viscosity for the liquid composition can be in the range of 5-15 cPs or 7-12 cPs at 23° C. For liquid compositions of small molecule materials, the solvent viscosity may be the major contributor of the viscosity of the liquid composition. As such, in some cases, the viscosity of the solvent used in the liquid composition can be in the range of 5-15 cPs or 7-12 cPs at 23° C. In some cases, the solvent has a lower boiling point than 3-phenoxytoluene and a higher viscosity than 3-phenoxytoluene.

The interaction of the solvent with the organic semiconductor material may affect the viscosity of the liquid composition. As such, the viscosity of the liquid composition may be adjusted by varying the selection of the solvent and/or the organic semiconductor material, or by varying the relative amounts of each. The liquid composition may also contain any of various other types of materials used in the fabrication of organic electronic devices, such as OLEDs. The organic layer may be any of those used in OLEDs (e.g., an emissive layer, a hole injection layer, or a hole transporting layer in an OLED).

In cases where the liquid composition is used to make an emissive layer of an OLED, in some cases, the liquid composition may include a small molecule host compound and a small molecule phosphorescent emitting compound as a dopant in the emissive layer. A host is a compound in the emissive layer that functions as the component which receives the hole/electron recombination energy and then by an emission/absorption energy transfer process, transfers that excitation energy to the phosphorescent dopant compound. The phosphorescent dopant is typically present in lower concentrations than the host compound. Examples of host compounds include $Alq_3$ [aluminum(III)tris(8-hydroxyquinoline)], mCP (1,3-N,N-dicarbazole-benzene), and CBP (4,4'-N,N-dicarbazole-biphenyl). Other materials that may be used as phosphorescent emitting compounds or host compounds are shown in Table 2 below.

The liquid composition is deposited onto the surface using any suitable solution processing technique known in the art. For example, the liquid composition can be deposited using a printing process, such as inkjet printing, nozzle printing, offset printing, transfer printing, or screen printing; or for example, using a coating process, such as spray coating, spin coating, or dip coating. After deposition of the liquid composition, the solvent is removed, which may be performed using any conventional method such as vacuum drying or heating.

In some cases, the liquid composition may have a blend of solvents. For example, the liquid composition may further include the solvents disclosed in U.S. Pat. No. 8,174,000 or those that are not solvents of the present invention. In such cases, the solvent(s) of the present invention constitutes at least 10% (by volume) of the solvent volume in the liquid composition. Such blended solvents can enhance film formation and/or reduce defects in the deposited organic layer. This second solvent can have various properties to complement those of the aryloxy-alkylcarboxylate solvent of the present invention, such as having a higher or lower boiling point or having a higher degree of interaction with the organic semiconductor material than the aryloxy-alkylcarboxylate solvent. An example of a solvent that can be used for blending is 3-phenoxytoluene, which has a relatively high boiling point and a relatively lower viscosity. As such, blending with 3-phenoxytoluene can be used to raise the boiling point or reduce the viscosity of the liquid composition.

The present invention can be used in the fabrication of a variety of organic electronic devices, including organic light emitting devices, organic field-effect transistors (OFETs), organic thin-film transistors (OTFTs), organic photovoltaic devices, and organic solar cells, such as those disclosed in U.S. Appln. Publication No. 2005/0072021 (Steiger et al.), which is incorporated by reference herein. For example, FIG. 1 shows an OLED 100 that may be made using the present invention. OLED 100 has an architecture that is well-known in the art (see, for example, U.S. Appln. Publication No. 2008/0220265 to Xia et al., which is incorporated by reference herein). As seen in FIG. 1, OLED 100 has a substrate 110, an anode 115, a hole injection layer 120 (HIL), a hole transport layer 125 (HTL), an electron blocking layer 130 (EBL), an emissive layer 135 (EML), a hole blocking layer 140 (HBL), an electron transport layer 145 (ETL), an electron injection layer 150 (EIL), a protective layer 155, and a cathode 160. Cathode 160 is a compound cathode having a first conductive layer 162 and a second conductive layer 164. Examples of dopants or hosts that can be used in the emissive layer are given in Table 2 below.

Where a first layer is described as being "over" a second layer, the first layer is positioned further away from substrate. There may be other layers between the first and second layer, unless it is specified that the first layer is "in physical contact with" the second layer. For example, a cathode may be described as being disposed "over" an anode, even though there are various organic layers in between.

EXAMPLES

Specific representative embodiments of the invention will now be described, including how such embodiments may be made. The specific methods, materials, conditions, process parameters, apparatus, and the like, do not necessarily limit the scope of the invention.

An experimental and a comparative device were made with the following sequentially deposited organic layers: HIL/HTL/EML/HBL/ETL. The hole injection layer was deposited by inkjet printing onto a 1200 Å thick ITO (indium tin oxide) anode using a mixture of Compound A and Compound B (in an 80:20 weight ratio) in tetralone solvent at 0.15 wt % concentration. The hole transport layer was deposited by inkjet printing onto the hole injection layer using 0.2 wt % of Compound C in 3-phenoxytoluene (3-PT) solvent. For the experimental device, the emissive layer was deposited by inkjet printing using Compound D:Compound Mixture E (88:12 ratio) in methyl phenoxyacetate (MPA) solvent at a concentration of 0.85%. For the comparative device, 3-phenoxytoluene (3-PT) was used as the solvent instead of MPA. MPA has a boiling point of ~245° C. and a viscosity of ~9 cPs at 23° C.; whereas 3-PT has a boiling point of ~275° C. and a viscosity of ~4.8 cPs at 23° C.

These inkjet-deposited layers were prepared in a nitrogen glove box with stirring to ensure complete dissolution of the materials. Deposition of the inkjet solutions was followed by immediate vacuum drying and baking: 250° C. for 30 mins. for the HIL; 200° C. for 30 mins. for the HTL; 100° C. for 60 mins. for the EML. A blocking layer containing Compound F, an electron transport layer containing Alq$_3$ [aluminum(III) tris(8 hydroxyquinoline)], and 10 Å LiF/1,000 Å of aluminum for the cathode were sequentially deposited by vacuum thermal evaporation in a conventional fashion. Immediately after fabrication, all devices were encapsulated with a glass lid sealed with an epoxy resin in a nitrogen glove box (1 ppm of H$_2$O and O$_2$), and a moisture getter was incorporated inside the package.

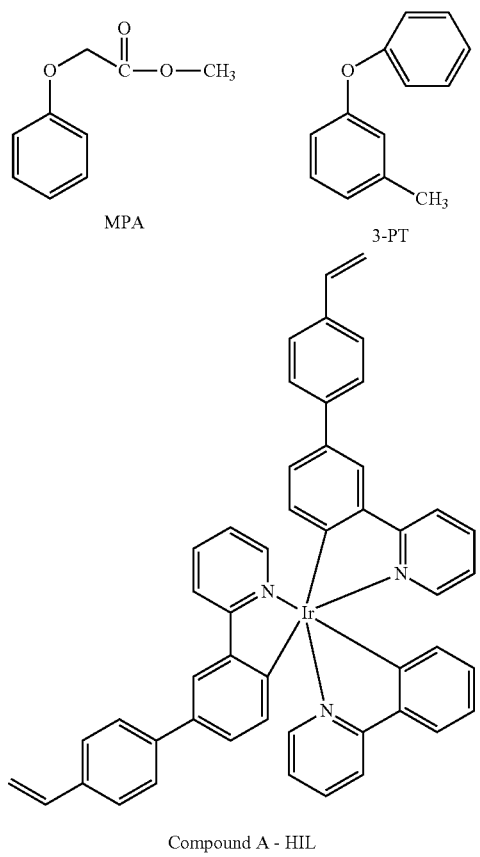

Compound A - HIL

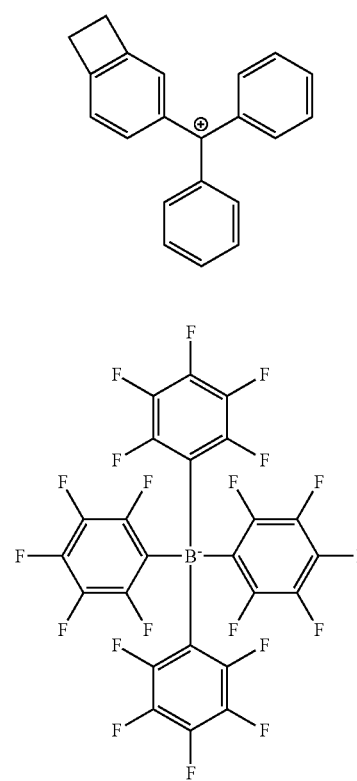

Compound B (conducting dopant) - HIL

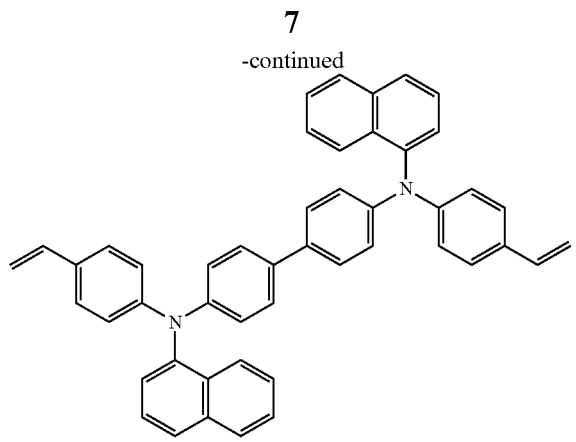
Compound C - HTL
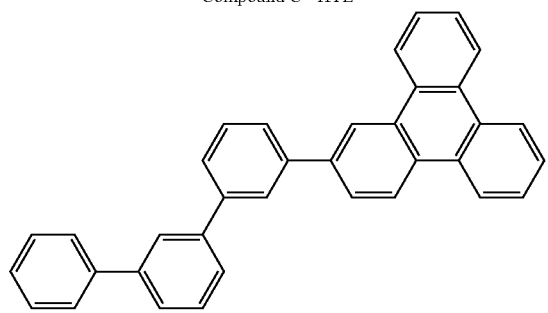
Compound D - EML host
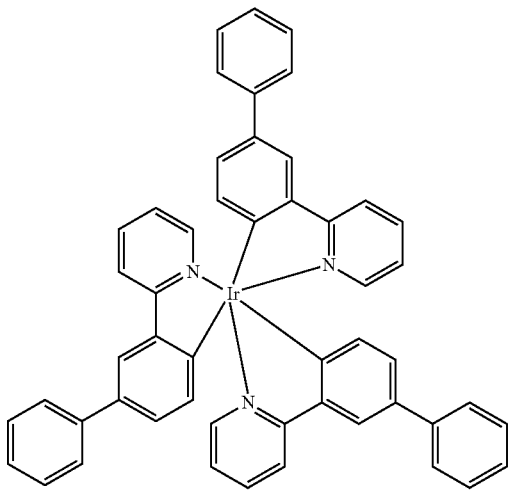
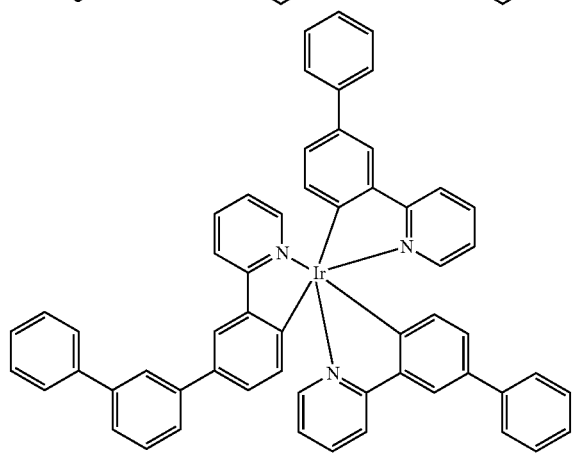
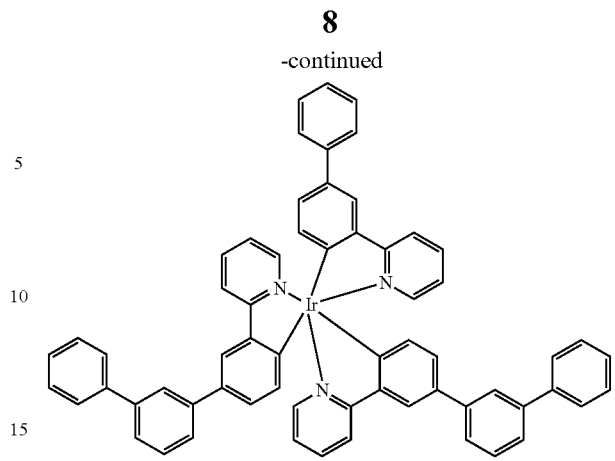
Compound Mixture E - EML green dopant
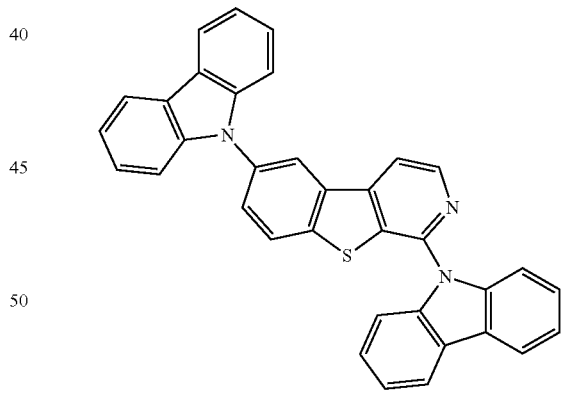
Compound F
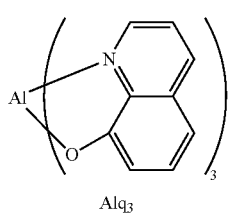
Alq₃

TABLE 1

|  | Comparative device (using 3-PT solvent) | Experimental device (using MPA solvent) |
|---|---|---|
| Voltage @ 10 mA/cm$^2$ | 8.2 | 7.6 |
| LE (cd/A) @ 10 mA/cm$^2$ | 38.8 | 46.4 |
| LT$_{80}$ (hours) @ 4k nits | 123 | 162 |
| CIE (x, y) | (0.34, 0.62) | (0.32, 0.63) |

Figure 2:
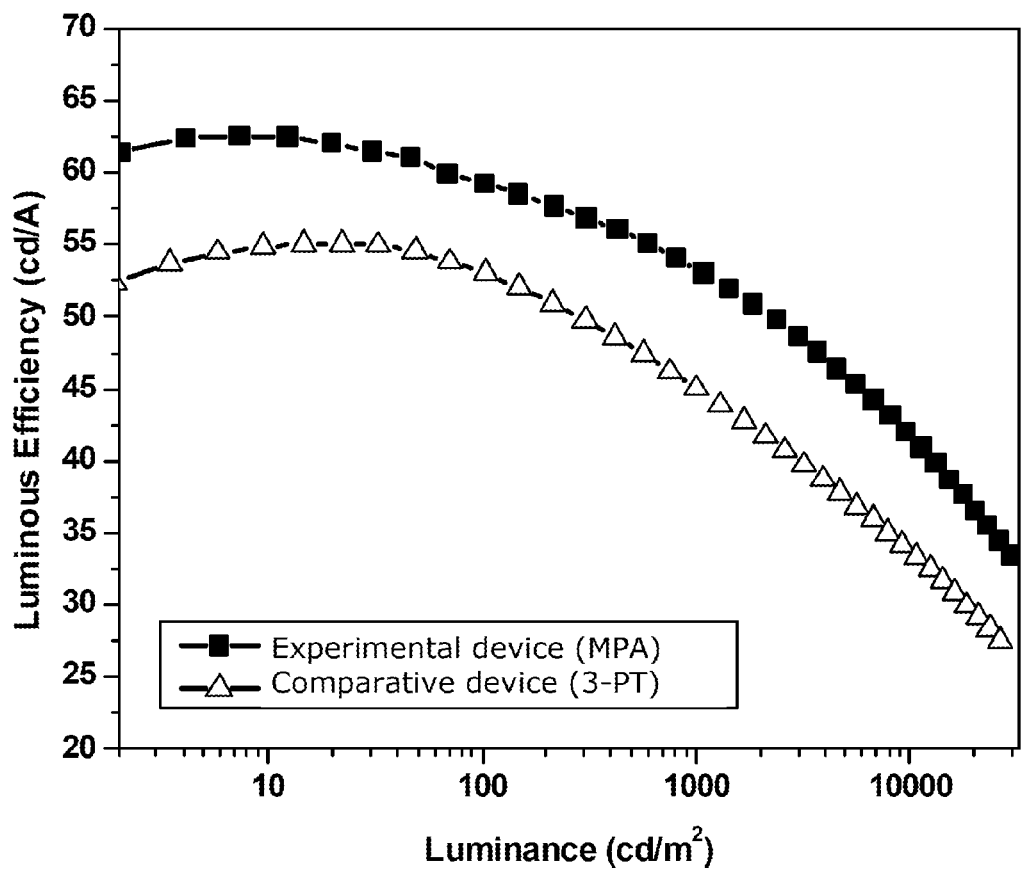
FIG. 2 shows a plot of the luminous efficiency of an experimental and comparative device.
Figure 3:
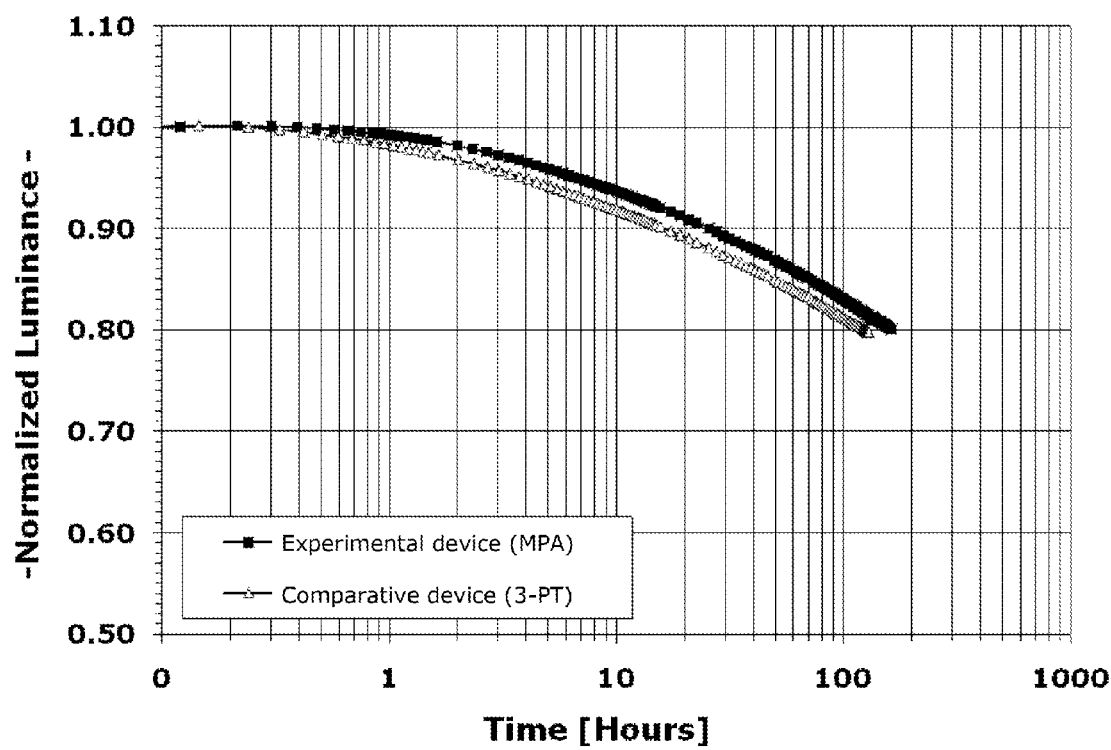
FIG. 3 shows the operating lifetime of an experimental and comparative device depicted as a plot of luminous intensity over time.

Table 1 above shows the voltage (V) that was needed to drive a constant current of 10 mA/cm$^2$ current density; luminous efficiency (LE) when operating at 10 mA/cm$^2$ current density; device lifetime as measured by time to decay of luminance to 80% of an initial luminance of 4,000 nits; and CIE color space coordinates of the emitted light. The luminous efficiency of the example OLEDs are also depicted as a plot shown in FIG. 2. The operating lifetimes of the example OLEDs are also depicted as a plot of luminous intensity over time as shown in FIG. 3.

These data demonstrate that the experimental device had higher luminous efficiency than the comparative device. Thus, using MPA for the solvent can give higher device efficiency. Furthermore, these data demonstrate that the experimental device had a longer lifetime than the comparative device. Thus, using MPA for the solvent can improve device stability. This improved device performance may be attributed to the lower boiling point and/or higher viscosity of MPA as compared with 3-PT. These properties may be beneficial for film formation during inkjet printing. These results demonstrate that the use of solvents of the present invention to deposit an organic layer by solution processing can enhance device performance.

The foregoing description and examples have been set forth merely to illustrate the invention and are not intended to be limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention.

TABLE 2

| MATERIAL | EXAMPLES OF MATERIAL | PUBLICATIONS |
|---|---|---|
| Phosphorescent OLED host materials | | |
| Red hosts | | |
| Arylcarbazoles | 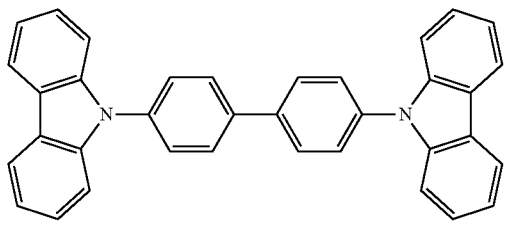 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., Alq$_3$, BAlq) | 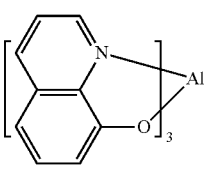 | Nature 395, 151 (1998) |
| | 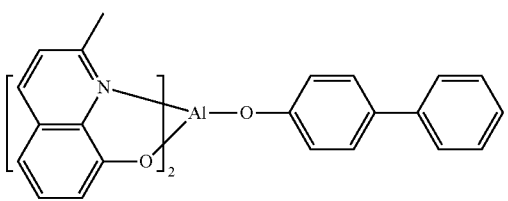 | US20060202194 |
| | 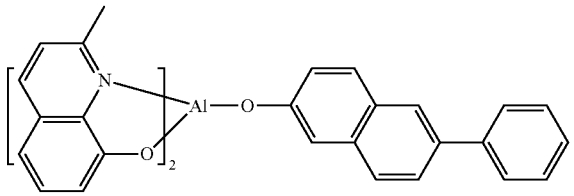 | WO2005014551 |

TABLE 2-continued

| MATERIAL | EXAMPLES OF MATERIAL | PUBLICATIONS |
| --- | --- | --- |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |
| Zinc complexes | | WO2009062578 |
| Green hosts | | |
| Arylcarbazoles | | Appl. Phys. Lett. 78, 1622 (2001) |

TABLE 2-continued
| MATERIAL | EXAMPLES OF MATERIAL | PUBLICATIONS |
|---|---|---|
| | 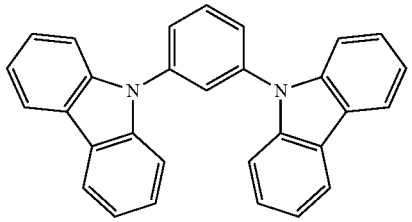 [SMILES: c1cc(-n2c3ccccc3c3ccccc32)cc(-n2c3ccccc3c3ccccc32)c1] | US20030175553 |
| | 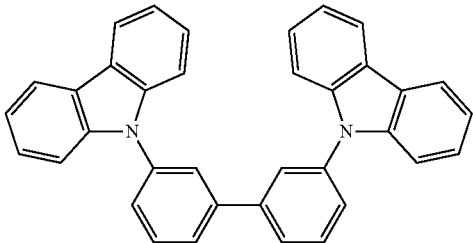 [SMILES: c1cc(-c2cccc(-n3c4ccccc4c4ccccc43)c2)cc(-n2c3ccccc3c3ccccc32)c1] | WO2001039234 |
| Aryltriphenylene compounds | 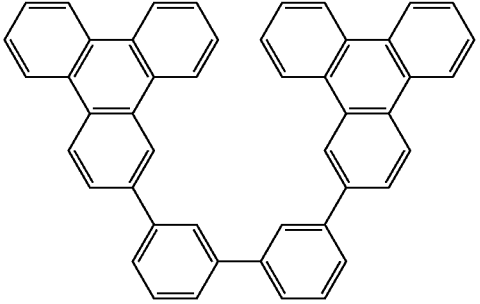 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 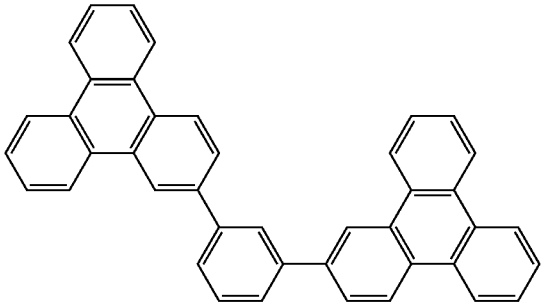 [SMILES: c1cc(-c2ccc3c4ccccc4c4ccccc4c3c2)cc(-c2ccc3c4ccccc4c4ccccc4c3c2)c1] | US20060280965 |
| | 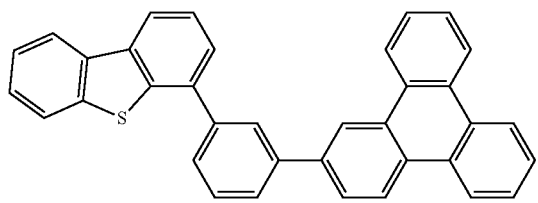 [SMILES: c1cc(-c2ccc3c4ccccc4c4ccccc4c3c2)cc(-c2cccc3c2sc2ccccc23)c1] | WO2009021126 |

TABLE 2-continued

| MATERIAL | EXAMPLES OF MATERIAL | PUBLICATIONS |
| --- | --- | --- |
| Donor acceptor type molecules | | WO2008056746 |
| Aza-carbazole/DBT/DBF | | JP2008074939 |
| Polymers (e.g., PVK) | | Appl. Phys. Lett. 77, 2280 (2000) |
| Spirofluorene compounds | | WO2004093207 |
| Metal phenoxybenzooxazole compounds | | WO2005089025 |

TABLE 2-continued
| MATERIAL | EXAMPLES OF MATERIAL | PUBLICATIONS |
|---|---|---|
| | 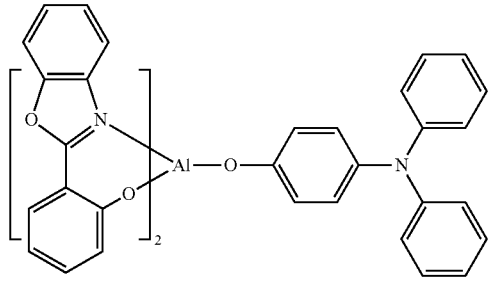 | WO2006132173 |
| | 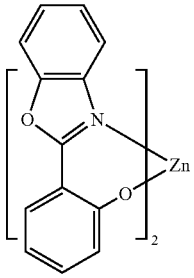 | JP200511610 |
| Spirofluorene-carbazole compounds | 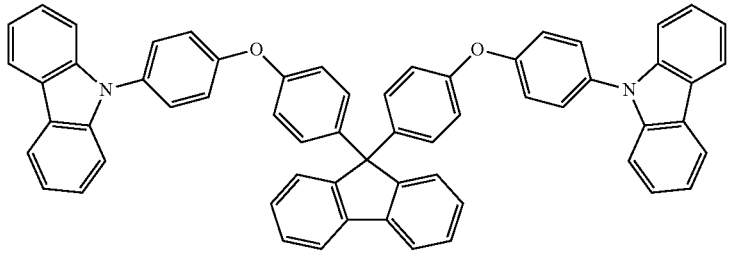 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 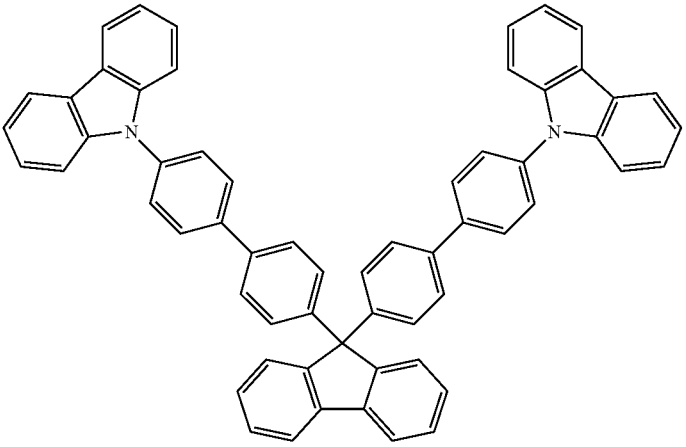 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 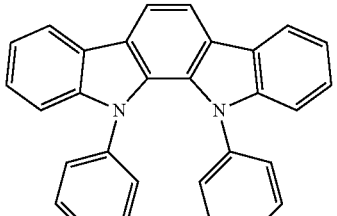 | WO2007063796 |

| MATERIAL | EXAMPLES OF MATERIAL | PUBLICATIONS |
|---|---|---|
| | 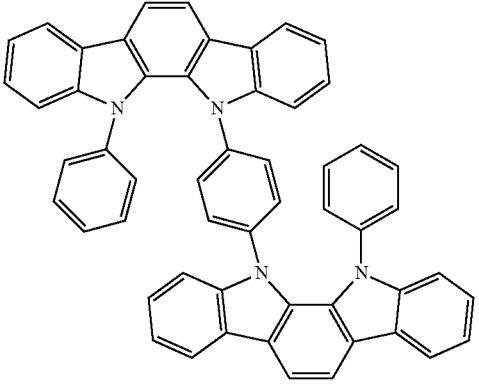 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 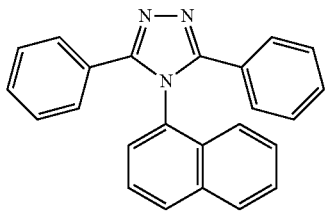 [SMILES: c1ccc(-c2nnc(-c3ccccc3)n2-c2cccc3ccccc23)cc1] | J. Appl. Phys. 90, 5048 (2001) |
| | 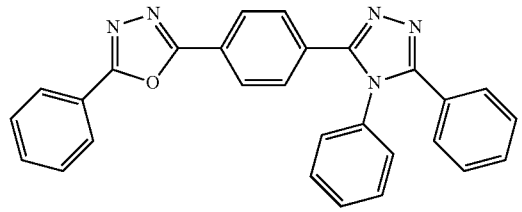 [SMILES: c1ccc(-c2nnc(-c3ccc(-c4nnc(-c5ccccc5)n4-c4ccccc4)cc3)o2)cc1] | WO2004107822 |
| Tetraphenylene complexes | 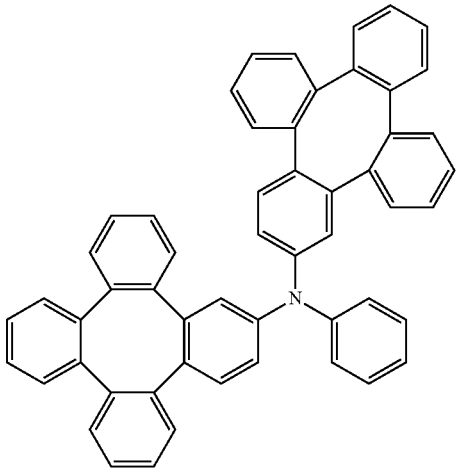 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 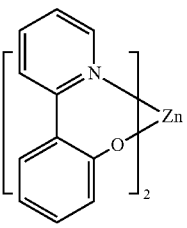 | WO2005030900 |

TABLE 2-continued

| MATERIAL | EXAMPLES OF MATERIAL | PUBLICATIONS |
| --- | --- | --- |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |
| Dibenzothiophene/ Dibenzofuran-carbazole compounds | | WO2006114966, US20090167162 |
| | | US20090167162 |
| | | WO2009086028 |

TABLE 2-continued

| MATERIAL | EXAMPLES OF MATERIAL | PUBLICATIONS |
| --- | --- | --- |
|  |  | US20090030202, US20090017330 |
| Silicon aryl compounds |  | US20050238919 |
|  |  | WO2009003898 |
| Silicon/Germanium aryl compounds |  | EP2034538A |
| Aryl benzoyl ester |  | WO2006100298 |
| High triplet metal organometallic complex |  | U.S. Pat. No. 7,154,114 |

TABLE 2-continued

| MATERIAL | EXAMPLES OF MATERIAL | PUBLICATIONS |
| --- | --- | --- |
| Phosphorescent dopants | | |
| Red dopants | | |
| Heavy metal porphyrins (e.g., PtOEP) | | Nature 395, 151 (1998) |
| Iridium(III) organometallic complexes | | Appl. Phys. Lett. 78, 1622 (2001) |
| | | US2006835469 |
| | | US2006835469 |
| | | US20060202194 |

TABLE 2-continued
| MATERIAL | EXAMPLES OF MATERIAL | PUBLICATIONS |
|---|---|---|
| | 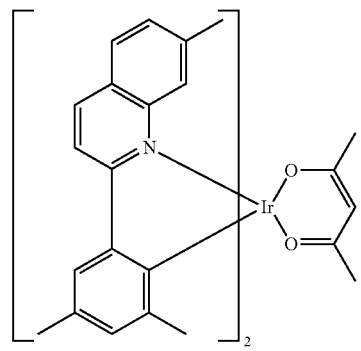 | US20060202194 |
| | 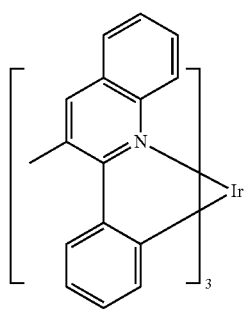 | US20070087321 |
| | 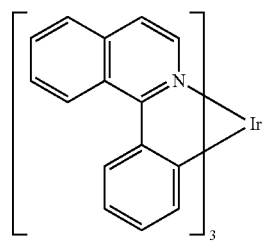 | US20070087321 |
| | 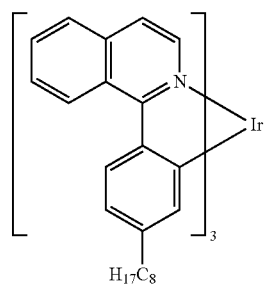 | Adv. Mater. 19, 739 (2007) |
| | 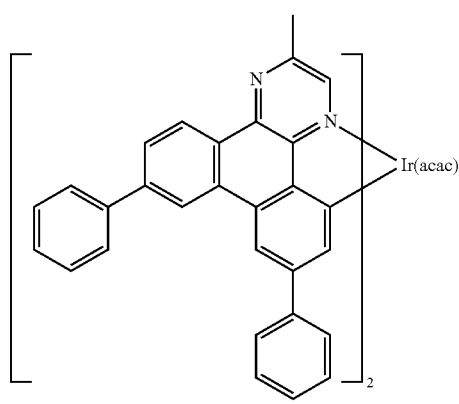 | WO2009100991 |

TABLE 2-continued
| MATERIAL | EXAMPLES OF MATERIAL | PUBLICATIONS |
|---|---|---|
| | 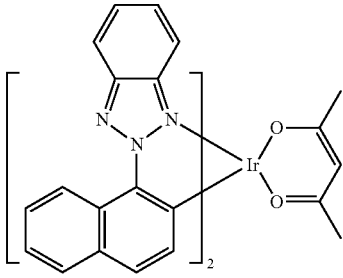 | WO2008101842 |
| Platinum(II) organometallic complexes | 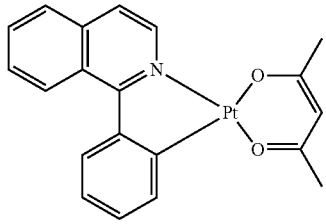 | WO2003040257 |
| Osminum(III) complexes | 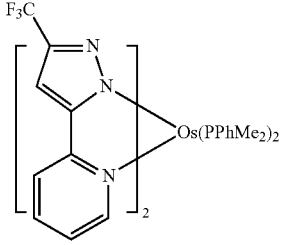 | Chem. Mater. 17, 3532 (2005) |
| Ruthenium(II) complexes | 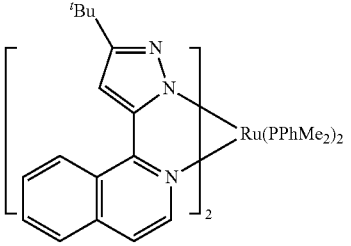 | Adv. Mater. 17, 1059 (2005) |
| Rhenium (I), (II), and (III) complexes | 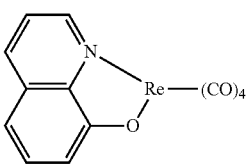 | US20050244673 |

TABLE 2-continued
| MATERIAL | EXAMPLES OF MATERIAL | PUBLICATIONS |
|---|---|---|
| Green dopants | | |
| Iridium(III) organometallic complexes | 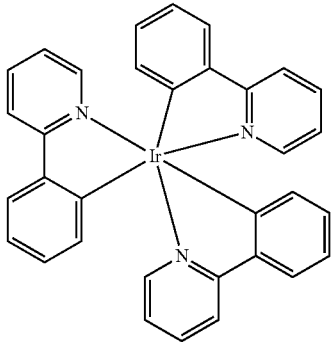 and its derivatives | Inorg. Chem. 40, 1704 (2001) |
| | 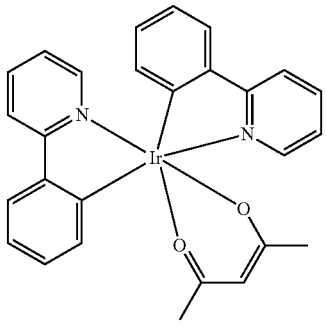 | US20020034656 |
| | 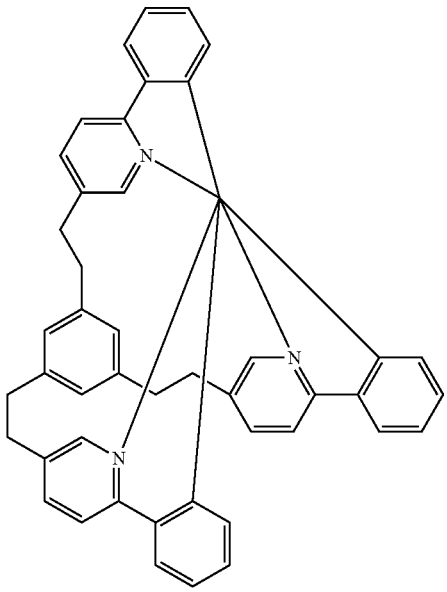 | U.S. Pat. No. 7,332,232 |

TABLE 2-continued

| MATERIAL | EXAMPLES OF MATERIAL | PUBLICATIONS |
|---|---|---|
|  |  | US20090108737 |
|  |  | US20090039776 |
|  |  | U.S. Pat. No. 6,921,915 |
|  |  | U.S. Pat. No. 6,687,266 |
|  |  | Chem. Mater. 16, 2480 (2004) |

TABLE 2-continued

| MATERIAL | EXAMPLES OF MATERIAL | PUBLICATIONS |
|---|---|---|
| | (structure) | US20070190359 |
| | (structure) | US 20060008670<br>JP2007123392 |
| | (structure) | Adv. Mater. 16, 2003 (2004) |
| | (structure) | Angew. Chem. Int. Ed. 2006, 45, 7800 |
| | (structure) | WO2009050290 |
| | (structure) | US20090165846 |

TABLE 2-continued

| MATERIAL | EXAMPLES OF MATERIAL | PUBLICATIONS |
|---|---|---|
| | | US20080015355 |
| Monomer for polymeric metal organometallic compounds | | U.S. Pat. No. 7,250,226, U.S. Pat. No. 7,396,598 |
| Pt(II) organometallic complexes, including polydentated ligands | | Appl. Phys. Lett. 86, 153505 (2005) |
| | | Appl. Phys. Lett. 86, 153505 (2005) |

TABLE 2-continued
| MATERIAL | EXAMPLES OF MATERIAL | PUBLICATIONS |
|---|---|---|
| | 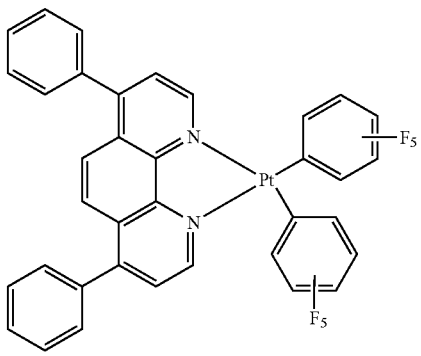 | Chem. Lett. 34, 592 (2005) |
| | 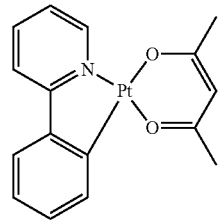 | WO2002015645 |
| | 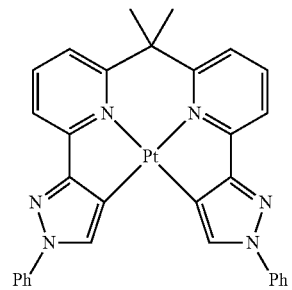 | US20060263635 |
| Cu complexes | 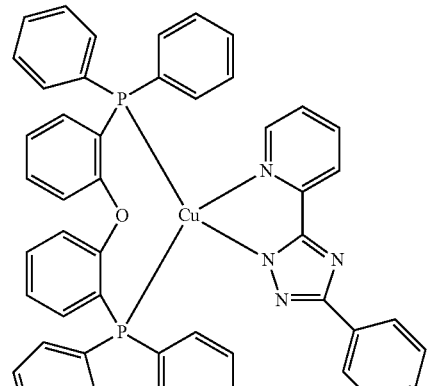 | WO2009000673 |

TABLE 2-continued

| MATERIAL | EXAMPLES OF MATERIAL | PUBLICATIONS |
| --- | --- | --- |
| Gold complexes | | Chem. Commun. 2906 (2005) |
| Rhenium(III) complexes | | Inorg. Chem. 42, 1248 (2003) |
| Deuterated organometallic complexes | | US20030138657 |
| Organometallic complexes with two or more metal centers | | US20030152802 |

TABLE 2-continued
| MATERIAL | EXAMPLES OF MATERIAL | PUBLICATIONS |
|---|---|---|
| | 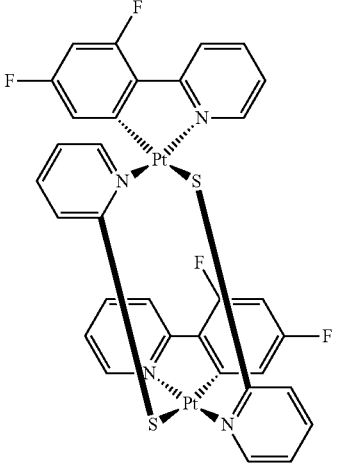 | U.S. Pat. No. 7,090,928 |
| Blue dopants | | |
| Iridium(III) organometallic complexes | 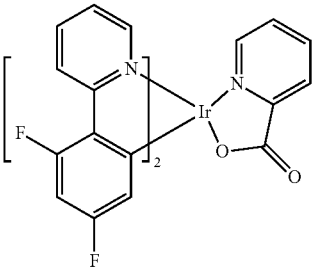 | WO2002002714 |
| | 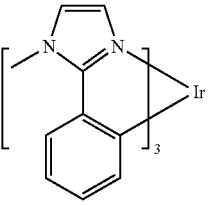 | WO2006009024 |
| | 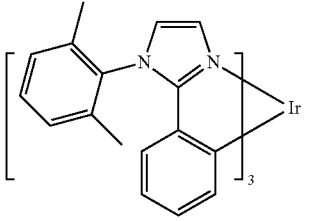 | US20060251923 |
| | 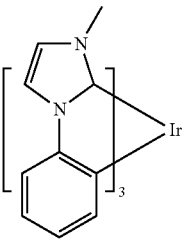 | U.S. Pat. No. 7,393,599, WO2006056418, US20050260441, WO2005019373 |

TABLE 2-continued
| MATERIAL | EXAMPLES OF MATERIAL | PUBLICATIONS |
|---|---|---|
| | 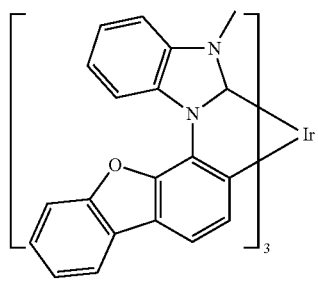 | U.S. Pat. No. 7,534,505 |
| | 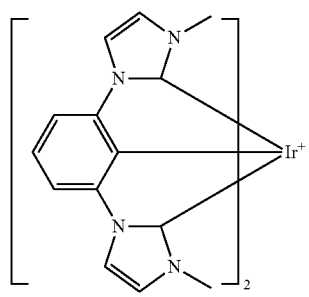 | U.S. Pat. No. 7,445,855 |
| | 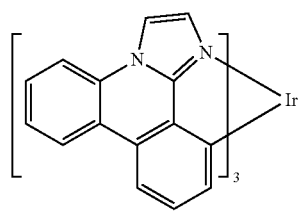 | US20070190359, US20080297033 |
| | 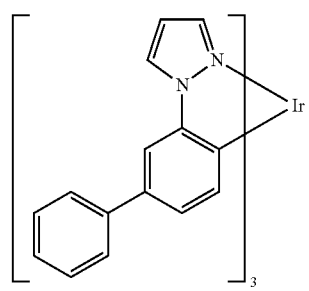 | U.S. Pat. No. 7,338,722 |
| | 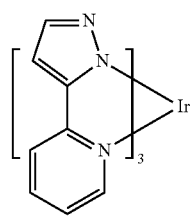 | US20020134984 |
| | 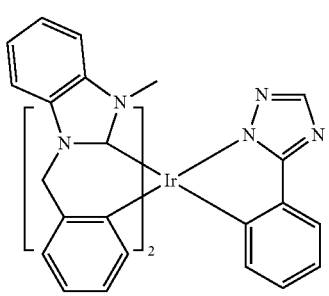 | Angew. Chem. Int. Ed. 47, 1 (2008) |

TABLE 2-continued

| MATERIAL | EXAMPLES OF MATERIAL | PUBLICATIONS |
|---|---|---|
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE 2-continued
| MATERIAL | EXAMPLES OF MATERIAL | PUBLICATIONS |
|---|---|---|
| | 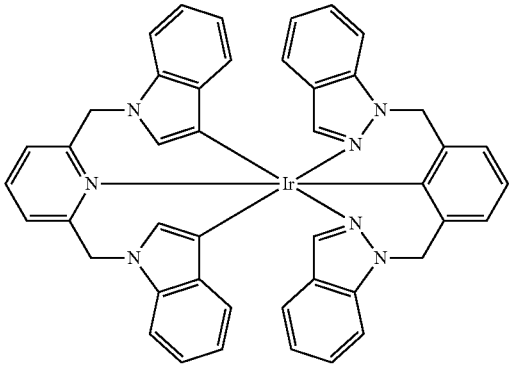 | WO2006082742 |
| Osmium(II) complexes | 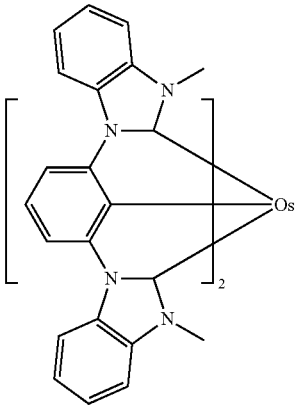 | U.S. Pat. No. 7,279,704 |
| | 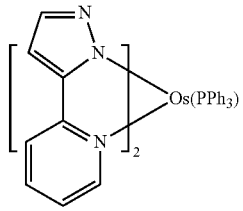 | Organometallics 23, 3745 (2004) |
| Gold complexes | 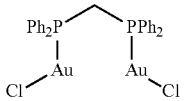 | Appl. Phys. Lett. 74, 1361 (1999) |
| Platinum(II) complexes | 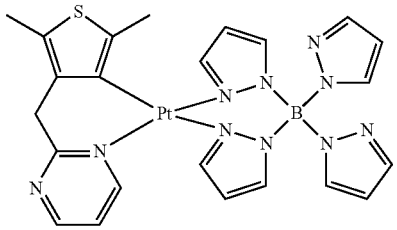 | WO2006098120, WO2006103874 |

We claim:
1. A liquid composition comprising:
   a small molecule organic semiconductor material at a concentration in the range of 0.01-10 wt %; and
   a solvent having a melting point of 25° C. or lower, the solvent compound having the following formula:

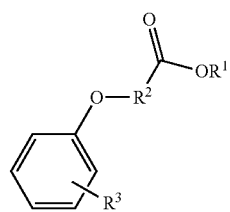

wherein $R^1$ is $C_{1-6}$ alkyl; $R^2$ is $C_{1-6}$ alkyl; and $R^3$ is one or more optional substitutions independently selected from $C_{1-6}$ alkyl and aryl.
2. The liquid composition of claim 1, wherein the solvent has a boiling point of 260° C. or lower at 1 atm.
3. The liquid composition of claim 2, wherein the solvent has a boiling point in the range of 150-260° C. at 1 atm.
4. The liquid composition of claim 1, wherein the solvent compound has a molecular weight in the range of 166-400.
5. The liquid composition of claim 1, wherein the small molecule organic semiconductor material is a phosphorescent emitting compound.
6. The liquid composition of claim 5, further comprising a small molecule host compound.
7. The liquid composition of claim 1, wherein the organic semiconductor material is a charge transporting material.
8. The liquid composition of claim 1, wherein the liquid composition has a viscosity in the range of 5-15 cPs at 23° C.
9. The liquid composition of claim 1, wherein the solvent has a viscosity in the range of 5-15 cPs at 23° C.
10. The liquid composition of claim 1, wherein the solvent is methyl phenoxyacetate or ethyl phenoxyacetate.
11. The liquid composition of claim 1, wherein the organic semiconductor material has a molecular weight of 3,000 or less.
12. The liquid composition of claim 1, further comprising another solvent to form a solvent blend.
13. The liquid composition of claim 12, wherein the another solvent is 3-phenoxytoluene.
14. The liquid composition of claim 1, wherein the solvent has a boiling point in the range of 150-260° C. at 1 atm, a viscosity in the range of 5-15 cPs at 23° C., and a molecular weight in the range of 166-400.
15. A method of forming an organic layer for an organic electronic device, comprising:
   depositing the liquid composition of claim 1 on a surface; and
   drying the liquid composition to form the organic layer on the surface.
16. The method of claim 15, wherein the organic electronic device is an organic light emitting device and the organic layer is an emissive layer.
17. The method of claim 16, wherein the surface is the surface of another organic layer or an electrode of the electronic device.

* * * * *